(12) United States Patent
Rodell

(10) Patent No.: US 11,169,234 B2
(45) Date of Patent: Nov. 9, 2021

(54) METHOD AND SYSTEM FOR DETERMINING NORMALIZED MAGNETIC RESONANCE RELAXATION PARAMETERS

(71) Applicant: Siemens Healthcare GmbH, Erlangen (DE)

(72) Inventor: Anders Rodell, Hjortshoj (DK)

(73) Assignee: Siemens Healthcare GmbH, Erlangen (DE)

( * ) Notice: Subject to any disclaimer, the term of this patent is extended or adjusted under 35 U.S.C. 154(b) by 28 days.

(21) Appl. No.: 16/703,404

(22) Filed: Dec. 4, 2019

(65) Prior Publication Data

US 2020/0182953 A1 Jun. 11, 2020

(30) Foreign Application Priority Data

Dec. 5, 2018 (EP) .................................... 18210372

(51) Int. Cl.
*G01R 33/50* (2006.01)
*G01R 33/56* (2006.01)
(52) U.S. Cl.
CPC .......... *G01R 33/50* (2013.01); *G01R 33/5602* (2013.01)
(58) Field of Classification Search
CPC ..................... G01R 33/50; G01R 33/5602
See application file for complete search history.

(56) References Cited

U.S. PATENT DOCUMENTS

| 2008/0077006 | A1 | 3/2008 | Katscher et al. | |
| 2010/0261993 | A1* | 10/2010 | van der Kouwe | A61B 5/055 600/410 |
| 2014/0167752 | A1* | 6/2014 | Hanada | G01R 33/4816 324/307 |
| 2015/0276906 | A1* | 10/2015 | Wiesinger | G01R 33/5608 324/309 |
| 2018/0203084 | A1 | 7/2018 | An et al. | |

OTHER PUBLICATIONS

A. E. Hansen et al: "Qualitative evaluation of UTE imaging from mMR VE11P", Dept. of Clinical Physiology, University of Copenhagen, Denmark, Apr. 2018.

(Continued)

*Primary Examiner* — Gregory H Curran
(74) *Attorney, Agent, or Firm* — Schiff Hardin LLP

(57) ABSTRACT

In a method for determining a normalized MR relaxation parameter for an object using an imaging sequence where the MR signal of the object under examination is detected at a first echo time and at a second echo time, a first MR signal for the object under examination obtained at the first echo time is determined, a second MR signal for the object under examination obtained at the second echo time is determined, a first reference MR signal obtained at the first echo time from a reference tissue having a known value for the MR relaxation parameter is determined, a second reference MR signal obtained at the second echo time from the reference tissue is determined, and the normalized MR relaxation parameter is calculated based on the first MR signal, the second MR signal, the first echo time, the second echo time, and the first and second reference MR signal.

15 Claims, 2 Drawing Sheets

(56) References Cited

OTHER PUBLICATIONS

Ladefoged et al: "Region specific optimization of continuous linear attenuation coefficients based on UTE (Resolute): application to PET/MR brain imaging", Phys. Med. Biol., 2015.
Juttukonda et al: "MR-based attenuation correction for PER/MRI neurological studies with continuous-valued attenuation coefficients for bone through a conversion from R2* to CT-Hounsfield units", HHS Public Access, Neuroimage, May 2015, vol. 112, pp. 160-168, doi: 10.1016/j.neuroimage.2015.03.009.
Keereman, Vincent et al: "MRI-Based Attenuation Correction for PET/MRI Using Ultrashort Echo Time Sequences", The Journal of Nuclear Medicine, vol. 51, No. 5, May 2010, pp. 812-818.
European extended Search Report dated Jul. 9, 2019, for Application No. 18210372.1.

* cited by examiner

METHOD AND SYSTEM FOR DETERMINING NORMALIZED MAGNETIC RESONANCE RELAXATION PARAMETERS

CROSS REFERENCE TO RELATED APPLICATIONS

This patent application claims priority to European Patent Application No. 18210372.1, filed Dec. 5, 2018, which is incorporated herein by reference in its entirety.

BACKGROUND

Field

The present application relates to a method for determining a normalized magnetic resonance (MR) relaxation parameter for an object under examination. Furthermore, a computing device configured to determine the normalized MR relaxation parameter is provided, and MR imaging system including the computing device, a computer program including program code and a carrier including the computer program is provided.

Related Art

PET is one diagnostic imaging method used for patients in oncology. Furthermore, combined PET/CT systems are known, wherein the CT images are used to determine an attenuation of the photons generated by the PET process. However, CT images have low soft tissue contrast which limits the use of the PET/CT systems. Additionally, PET/MR systems are known wherein the MR images provide a better soft tissue contrast, however one challenging aspect in PET/MR systems is the separation of bone and air as neither the bone nor the air has a signal in the traditional MR images. Accordingly, it is difficult to determine the photon attenuation only based on the MR images. Recently ultrashort echo time, UTE, MR imaging sequences where proposed in which MR signals are obtained at a very short echo time where a signal can be obtained from the bone at least in the first echo time of the UTE imaging sequence.

Furthermore, it is known that the relaxation rate R2* values $$\left(R_2^* = \frac{1}{T2^*}\right)$$

deduced from the ultra-short echo time imaging sequences can be mapped to linear attenuation coefficient values, LAC, which are used for the PET images.

It is known to determine the R2* value as follows:

$$R_2^* = \frac{\ln(UTE_{TE1}) - \ln(UTE_{TE2})}{TE_2 - TE_1} \quad (1)$$

Equation (1) is known from Keereeman V, Fierens Y, Broux T, De Deene Y, Lonneux M and Vandenberghe S: "MRI-based attenuation correction for PET/MRI using ultrashort echo time sequences" *J. Nucl. Med.* 51 812-8; 2010. The difference between the signal of the UTE sequence at a first echo time and the second echo time provides a signal in voxels with bone. Using r2* as a measure, it is possible to distinguish cortical bone from soft tissue because of the significant difference in relaxation rate between both tissue types.

Even though R2* should be a fixed quantitative parameter describing the inverse of the T2* relaxation time, the lack of signal from bone, the second echo at the second echo time, TE2, and the change in the MR contrast in general seems to change the R2* value dependent on the echo time and the used imaging sequence.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
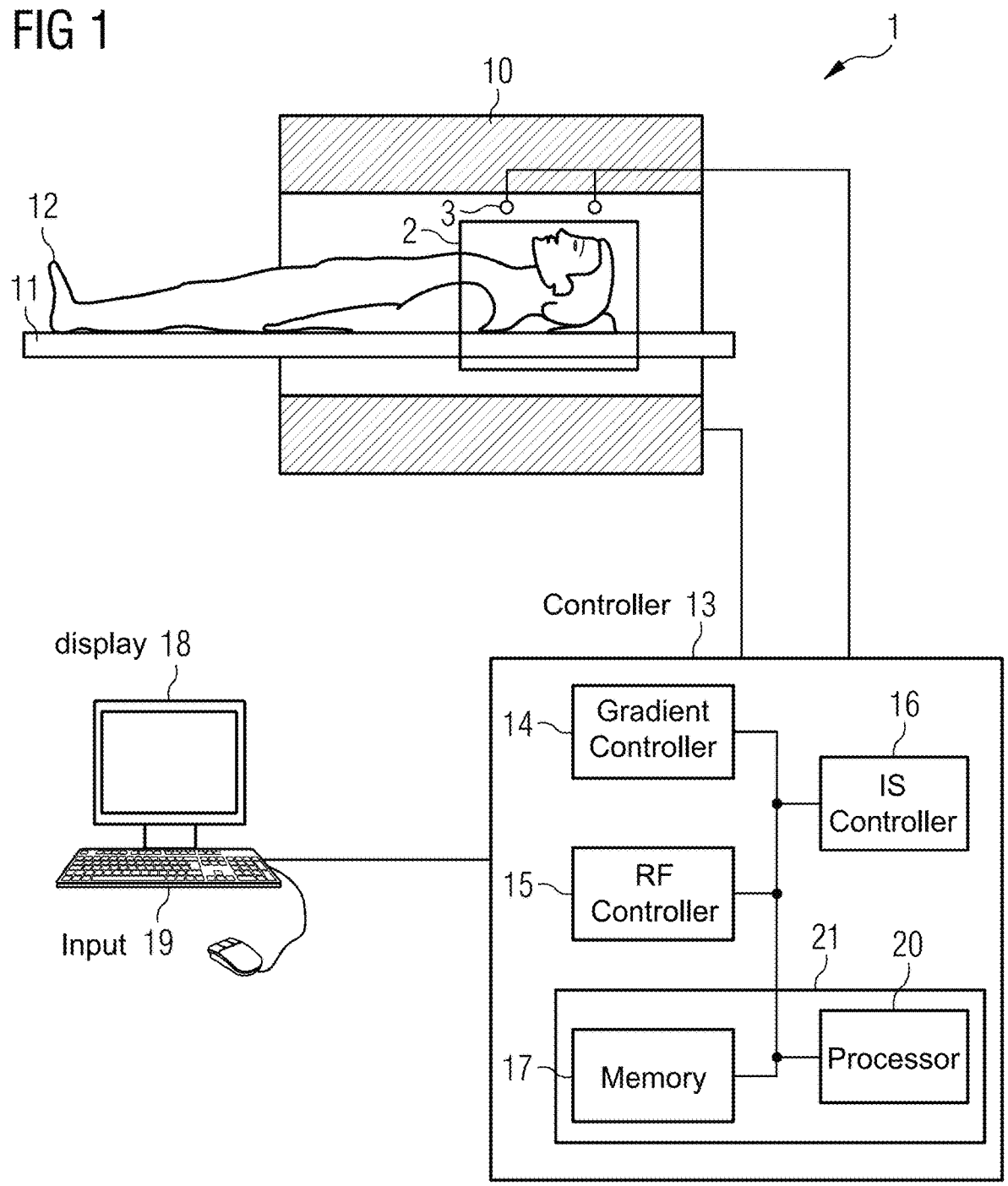
FIG. 1 illustrates a magnetic resonance (MR) system according to an exemplary embodiment, which is configured to determine a normalized MR relaxation parameter value.

The exemplary embodiments of the present disclosure will be described with reference to the accompanying drawings. Elements, features and components that are identical, functionally identical and have the same effect are—insofar as is not stated otherwise—respectively provided with the same reference character.

The drawings are to be regarded as being schematic representations, and elements illustrated in the drawings are not necessarily shown to scale. Rather, the various elements are represented such that their function and general purpose becomes apparent to a person skilled in the art. Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

The inventors have found that the R2* values discussed above depend on the echo times and the imaging sequence used. However, when the R2* value depends on the imaging sequence different results are obtained for the linear attenuation coefficient values. This is an undesired effect and an object of the disclosure is to provide an improved method for determining MR relaxation parameters, such as the R2* values, independent of the imaging sequence used so that reliable results are obtained.

According to an aspect a method for determining a normalized MR relaxation parameter for an object under examination is provided. The method can use an imaging sequence in which the MR signal of the object under examination is detected at a first echo time TE1 and at a second echo time TE2. According to the method, the first MR signal is determined for the object under examination obtained at the first echo time TE1 and the second MR signal is determined for the object under examination obtained at the second echo time TE2. Furthermore, a first reference MR signal is determined obtained at the first echo time TE1 from a reference tissue having a known value for the MR relaxation parameter. Additionally, a second reference MR signal is determined obtained at a second echo time TE2 from the reference tissue. The normalized MR relaxation parameter is then calculated based on the first MR signal, the second MR signal, the first echo time TE1, the second echo time TE2, the first and second reference MR signals. With the normalization and the use of the reference MR signals, it is possible to determine an imaging sequence independent MR relaxation parameter, such as the R2* value. When the R2* value independent of the imaging sequence is known, more precise attenuation coefficient values can be determined which might be used in the PET imaging processing.

In an exemplary embodiment, an imaging sequence dependent MR relaxation parameter is determined based on the first MR signal, the second MR signal, the first echo time TE1 and the second echo time TE2. In an exemplary embodiment, a simple constant value can be added to this image sequence dependent MR relaxation parameter which only depends on the first echo time TE1, the second echo time TE2, a first normalization factor determined from the first reference MR signal and a second normalization factor determined from the second reference MR signal.

Accordingly, this means that there is a constant off-set between the MR relaxation parameter which depends on the imaging sequence and the normalized MR relaxation parameter which does not depend on the imaging sequence.

In an exemplary embodiment, the MR relaxation parameter is R2*, however the method of determining the normalized MR relaxation parameter may also apply to R2.

In an exemplary embodiment, the reference tissue from which the first reference MR signal and the second reference MR signal is determined may be from the object under examination and may include brain tissue of the object under examination. For brain tissue, the R2* value is known and considered fixed.

In an exemplary embodiment, the reference tissue is not from the object under examination, but is added to the imaging space in which the first and the second MR signals are detected.

In an exemplary embodiment, the normalized R2* value (nR2*) is determined as follows:

$$nR_2^* = \frac{\ln(k1/k2)}{TE_2 - TE_1} + R_2^* \quad (2)$$

K1 is the first normalization factor which is determined using the first reference signal and the first MR signal wherein K2 is the second normalization factor determined with the second reference MR signal and the second MR signal, relaxation rate R2* is determined as known from equation (1) above.

In an exemplary embodiment, when the normalized R2 value is known, it is possible to calculate an attenuation coefficient for the object under examination based on the determined normalized value. Furthermore, an attenuation correction for the object under examination can be determined based on the calculated attenuation coefficient.

Additionally, a bone tissue density can be determined on the calculated attenuation coefficient for the object under examination.

As indicated above the imaging sequence maybe an UTE imaging sequence.

In an exemplary embodiment, a computing device (computer) is provided that includes a memory and at least one processor. The memory contains instructions executable by the at least one processor, where the computing device is configured to perform the methods according to the present disclosure.

In an exemplary embodiment, a magnetic resonance (MR) imaging system is provided that includes the computing device as mentioned above.

Furthermore, a computer program including program code to be executed by at least one processor of a computing device is provided and the execution of the program code causes the at least one processor to execute a method as discussed above or as discussed in further detail below.

In addition, a carrier including the computer program is provided wherein the carrier is one of an electronic signal, optical signal, radio signal or computer readable storage medium.

FIG. 1 shows a schematic view of an MR system 1 according to an exemplary embodiment. The MR system 1 is configured to determine a normalized MR relaxation parameter such as the R2* value.

In an exemplary embodiment, the MR system 1 includes a magnet 10 generating a polarization field BO. An object under examination 12 is lying on a table 11 and is moved into the center of the MR system 1 where MR signals generated by RF excitation pulses can be detected with receiving coils 2 or 3. The coils may be also used for transmitting the RF pulses into the object under examination. With the application of RF pulses and magnetic field gradients, the nuclear spins of the object 12 are excited and the currents induced by the relaxation process are detected. The general way how MR images are generated and how the MR signals are detected using a sequence of RF pulses in the sequence of magnetic field gradients determined by an imaging sequence is known to the person skilled in the art and is not explained in detail.

In an exemplary embodiment, the MR system includes a controller 13 configured to control the MR system 1. In an exemplary embodiment, the controller 13 includes a gradient controller 14 configured to control the switching of the magnetic field gradients needed for the spatial encoding of the MR signals. A radio frequency (RF) controller 15 is provided that is configured to generate the RF pulses that are needed for the imaging sequence used. An imaging sequence (IS) controller 16 is provided that is configured to control in dependence on the fact which imaging sequence is selected, the sequence of the RF pulses and the used magnetic field gradients. In a memory 17, computer programs needed for operating the MR system and the imaging sequence for generating the MR images may be stored together with the generated MR images. The generated MR images may be displayed on a display 18 wherein an input unit (e.g.

keyboard, mouse, etc.) or human machine interface 19 is provided used by a user of the MR system 1 to control the functioning of the MR imaging system. A processor 20 is provided which can coordinate the operation of different functional units shown in FIG. 1 and which can include one or more processors which can carry out instructions stored on the memory 17. The memory 17 can furthermore include suitable program code to be executed by the processor 20 so as to implement the disclosure as discussed above or as discussed in further detail below. In an exemplary embodiment, the memory 17 and processor 20 form a computing device 21 which is configured to determine a normalized R2* value as will be explained below. In an exemplary embodiment, the controller 13 (or one or more components therein) includes processor circuitry that is configured to perform one or more respective functions and/or operations of the controller 13 (or the respective component(s)).

As far as the imaging sequence is concerned, the UTE imaging sequence may be used which detects a signal at a first echo time TE1 and at a second echo time TE2. Possible values could be 0.07/2.46 ms, with a repetition time around 12 ms. However it should be understood that other values may be used. Thus, a first echo time may be smaller 1 ms, wherein the second echo time may be between 2 and 3 ms. By using normalized signal values from the obtained images a normalized R2* value (nR2*) can be determined. To this end, the MR signal of a reference tissue is obtained at the first echo time and of the second echo time wherein the R2* value for this reference tissue is known.

By way of example, when the brain is the object under examination, the brain tissue may be used as reference signal. In an exemplary embodiment, the MR signals at the first echo time and the second echo time can be normalized to a constant central soft tissue mean by two factors K1 and K2 as follows:

$$n\text{UTE}_{TE1} = k1 * \text{UTE}_{TE1}, n\text{UTE}_{TE2} = k2 * \text{UTE}_{TE2} \quad (3)$$

Accordingly, in an exemplary embodiment, the normalized R2* value, an R2* value can be determined as follows:

$$nR_2^* = \frac{\ln(UTE_{TE1}) - \ln(UTE_{TE2})}{TE_2 - TE_1} \quad (4)$$

$$nR_2^* = \frac{\ln(k_1 UTE_{TE1}) - \ln(k_2 UTE_{TE2})}{TE_2 - TE_1}$$

$$nR_2^* = \frac{\ln(k_1) + (UTE_{TE1}) - \ln(k_2) - (UTE_{TE2})}{TE_2 - TE_1}$$

$$nR_2^* = \frac{ln(k1/k2)}{TE_2 - TE_1} + \frac{\ln(UTE_{TE1}) - \ln(UTE_{TE2})}{TE_2 - TE_1}$$

This leads to the following equation, taking into account equation 1:

$$nR_2^* = \frac{\ln(k1/k2)}{TE_2 - TE_1} + R_2^*$$

This means that there is a constant offset between the R2* value calculated directly from the used imaging sequence and the normalized R2* value (nR2*) based on the normalized values. The normalization could be obtained by identifying a volume of interest in the central brain.

Accordingly, when a normalized R2* value is known improved linear attenuation coefficient values, LACs, can be calculated based on the soft tissue normalized values.

Figure 2:
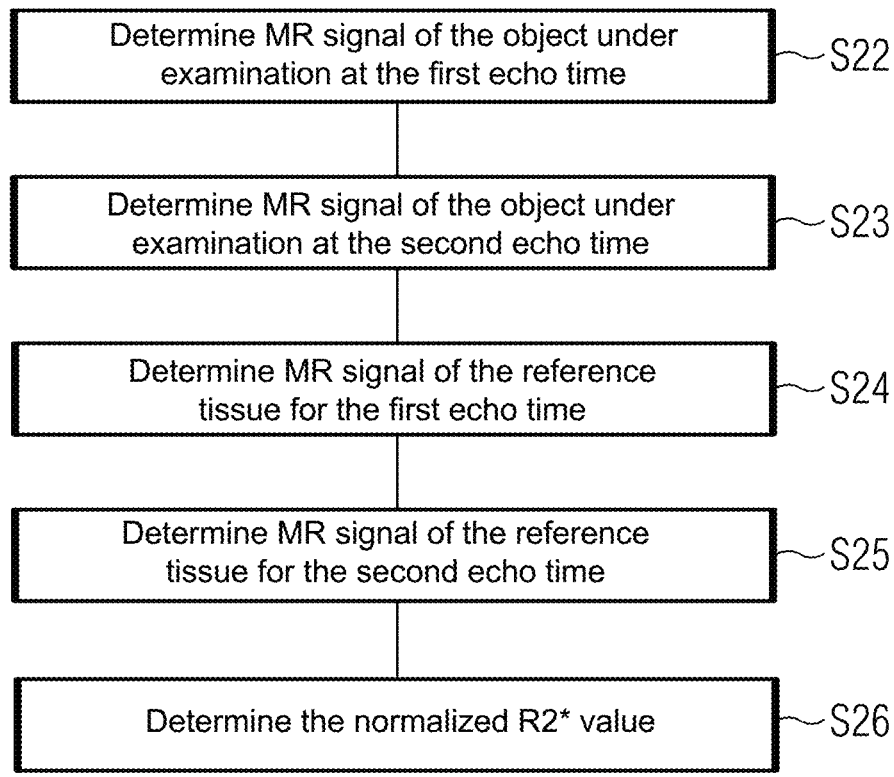
FIG. 2 is a flowchart of a method for determining a normalized MR relaxation parameter value according to an exemplary embodiment.

FIG. 2 illustrates a method for determining the normalized R2* value according to an exemplary embodiment. In step S22 the MR signal of the object under examination at the first echo time TE1 is determined. In step S23, the MR signal from the object under examination 12 is determined as it was obtained at the second echo time TE2. Furthermore, the reference MR signal of the reference tissue is obtained for the first echo time step S24 and the reference MR signal obtained for the second echo time TE2 is determined in step S25. In step S26 the normalized R2* value is then determined as mentioned above with equations 2 to 4.

Summarizing, the present application decouples the determination of the R2* value from the used imaging sequence and to used MR scanner and provides a more reliable result for the R2* value.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for determining a normalized magnetic resonance (MR) relaxation parameter for an object under examination using an imaging sequence in which the MR signal of the object under examination is detected at a first echo time and at a second echo time, the method comprising:
    determining the first MR signal for the object under examination obtained at the fist echo time;
    determining the second MR signal for the object under examination obtained at the second echo time;
    determining a first reference MR signal obtained at the first echo time from a reference tissue having a known value for the MR relaxation parameter;
    determining a second reference MR signal obtained at the second echo time from the reference tissue; and
    calculating the normalized MR relaxation parameter based on the first MR signal, the second MR signal, the first echo time, the second echo time, and the first and second reference MR signal, wherein the normalized MR relaxation parameter satisfies the following equation:

$$nR_2^* = \frac{\ln(k1/k2)}{TE_2 - TE_1} + R_2^*$$

where nR2* is the normalized MR relaxation parameter, TE1 is the first echo time, TE2 is the second echo time, k1 is a normalization factor for determining the first reference signal from the first MR signal, k2 is the normalization factor for determining the second reference signal from the second MR signal, and R2* is an image sequence dependent MR relaxation parameter which depends on the first echo time TE1, the second echo time TE2, the first MR signal, and the second MR signal.

2. The method according to claim 1, wherein the normalized MR relaxation parameter is an image sequence dependent MR relaxation parameter that equals the inverse of a relaxation time.

3. The method according to claim 1, wherein the reference tissue is from the object under examination.

4. The method according to claim 3, wherein the reference tissue comprises brain tissue of the object under examination.

5. The method according to claim 1, wherein the reference tissue is added to an imaging space in which the first and second MR signals are detected.

6. The method according to claim 5, wherein the reference tissue is non-object-under-examination tissue.

7. The method according to claim 2, further comprising:
    calculating an attenuation coefficient of the object under examination based on the determined normalized MR relaxation parameter; and
    determining an attenuation correction of the object under examination based on the calculated attenuation coefficient.

8. The method according to claim 7, further comprising determining a bone tissue density based on the calculated attenuation coefficient.

9. The method according to claim 1, wherein the imaging sequence is an imaging sequence having ultra-short echo times.

10. A non-transitory computer-readable storage medium with an executable program stored thereon, that when executed, instructs a processor to perform the method of claim 1.

11. A non-transitory computer program product having a computer program which is directly-loadable into a memory of a controller of the magnetic resonance device, when executed by the controller, causes the magnetic resonance device to perform the method as claimed in claim 1.

12. A computing device configured to determine a normalized magnetic resonance (MR) relaxation parameter for an object under examination using an imaging sequence in which a MR signal of the object under examination is detected at a first echo time and at a second echo time, the computing device comprising:
    a memory that includes executable instructions; and
    a processor configured to execute the executable instructions to:
        determine the first MR signal for the object under examination obtained at the first echo time;
        determine the second MR signal for the object under examination obtained at the second echo time;
        determine a first reference MR signal obtained at the first echo time from a reference tissue having a known value for the MR relaxation parameter;
        determine a second reference MR signal obtained at the second echo time from the reference tissue; and
        calculate the normalized MR relaxation parameter based on the first MR signal, the second MR signal, the first echo time, the second echo time, and the first and second reference MR signal, wherein the normalized MR relaxation parameter is an image sequence dependent MR relaxation parameter that equals the inverse of a relaxation time, the normalized image sequence dependent MR relaxation parameter satisfying the following equation:

$$nR_2^* = \frac{\ln(k1/k2)}{TE_2 - TE_1} + R_2^*$$

where nR2* is the normalized image sequence dependent MR relaxation parameter, TE1 is the first echo time, TE2 is the second echo time, k1 is a normalization factor for determining the first reference signal from the first MR signal, k2 is the normalization factor for determining the second reference signal from the second MR signal, and R2* is the image sequence dependent MR relaxation parameter which depends on the first echo time TE1, the second echo time TE2, the first MR signal, and the second MR signal.

13. The computing device according to claim 12, wherein the reference tissue comprises brain tissue of the object under examination.

14. The computing device according to claim 12, wherein the reference tissue is added to an imaging space in which the first and second MR signals are detected, and wherein the reference tissue is non-object-under-examination tissue.

15. A method for determining a normalized magnetic resonance (MR) relaxation parameter for an object under examination using an imaging sequence in which the MR signal of the object under examination is detected at a first echo time and at a second echo time, the method comprising:
- determining the first MR signal for the object under examination obtained at the first echo time;
- determining the second MR signal for the object under examination obtained at the second echo time;
- determining a first reference MR signal obtained at the first echo time from a reference tissue having a known value for the MR relaxation parameter;
- determining a second reference MR signal obtained at the second echo time from the reference tissue; and
- calculating the normalized MR relaxation parameter based on the first MR signal, the second MR signal, the first echo time, the second echo time, and the first and second reference MR signal, wherein the normalized MR relaxation parameter is an image sequence dependent MR relaxation parameter that equals the inverse of a relaxation time, the normalized image sequence dependent MR relaxation parameter satisfying the following equation:

$$nR_2^* = \frac{\ln(k1/k2)}{TE_2 - TE_1} + R_2^*$$

where $nR_2^*$ is the normalized image sequence dependent MR relaxation parameter, $TE_1$ is the first echo time, $TE_2$ is the second echo time, k1 is a normalization factor for determining the first reference signal from the first MR signal, k2 is the normalization factor for determining the second reference signal from the second MR signal, and $R_2^*$ is the image sequence dependent MR relaxation parameter which depends on the first echo time $TE_1$, the second echo time $TE_2$, the first MR signal, and the second MR signal.

* * * * *